United States Patent [19]
Downey

[11] Patent Number: 6,069,062
[45] Date of Patent: May 30, 2000

[54] METHODS FOR FORMING SHALLOW JUNCTIONS IN SEMICONDUCTOR WAFERS

[75] Inventor: Daniel F. Downey, Magnolia, Mass.

[73] Assignee: Varian Semiconductor Equipment Associates, Inc., Gloucester, Mass.

[21] Appl. No.: 08/929,973

[22] Filed: Sep. 16, 1997

[51] Int. Cl.$^7$ ................................................. H01L 21/265
[52] U.S. Cl. ............................................................ 438/528
[58] Field of Search .................................. 438/514, 513, 438/528, 530, 527, 515

[56] References Cited

U.S. PATENT DOCUMENTS

| | | | |
|---|---|---|---|
| 4,584,026 | 4/1986 | Wu et al. | 938/530 |
| 4,617,066 | 10/1986 | Vasudev | 438/530 |
| 5,108,935 | 4/1992 | Rodder | 438/528 |
| 5,407,838 | 4/1995 | Ohnishi et al. | 428/369 |

(List continued on next page.)

FOREIGN PATENT DOCUMENTS

| | | |
|---|---|---|
| 417 955A1 | 3/1991 | European Pat. Off. . |
| 326 513 1 | 11/1991 | Japan . |

OTHER PUBLICATIONS

K. Ohyo, et al., entitled "Advantages of Fluorine Introduction in Boron Implanted Shallow p$^+$/n–Junction Formation", published in *Japanese Journal of Applied Physics*, vol. 29, 1990, pp. 457–462.

D.F. Downey, et al., entitled "Control of BF$_2$ Dissociation in High Current Ion Implantation", published in 8$^{th}$ International Conference on Ion Implant Technology, Jul. 30–Aug. 3, 1990, pp. 1–80.

M. Minondo, et al., entitled "Comparison of $^{11}$B$^+$ and $^{49}$BF$_2$+ at Low Implantation Energy in Germanium Preamorphized Silicon", published in 9$^{th}$ International Conference on Ion Implant Technology, Sep. 1992.

T.H. Huang, et al., entitled "Influence of Fluorine Preamorphization on the Diffusion and Activation of Low–Energy Implanted Boron Rapid Thermal Annealing", published in *Appl. Phys. Lett.*, vol. 65, No. 14, Oct. 1994, pp. 1829–1831.

H.C. Mogul, et al., entitled "Advantages of LDD–Only Implanted Fluorine with Submicron CMOS Technologies", published in *IEEE Trans. On Electron Devices*, vol. 44, No. 3, Mar. 1997, pp. 388–394.

A. Hori, et al., entitled "High Speed 0.1um Dual Gate CMOS with Low Energy Phosphorus/Boron Implantation and Cobalt Salicide", published in *IEDM 96*, 1996, pp. 575–578.

L.Y. Krasnobaev, et al., entitled "The effect of Fluorine on the Redistribution of Boron in Ion–Implanted Silicon", published in *J. Appl. Phys.*, vol. 74, No. 10, Nov. 1993, pp. 6020–6022.

D. Fan et al., entitled "Effect of Fluorine on the Diffusion of Through–Oxide Implanted Boron in Silicon", published in *Appl. Phys. Lett.*, vol. 50, No. 10, Sep. 1991, pp. 1212–1214.

S.B. Felch, et al., entitled "Fluorine Effects in BF$_2$ Implants at Various Energies", published in 11$^{th}$ International Conference on Ion Implant Technology, Jun. 1996.

(List continued on next page.)

*Primary Examiner*—Savitri Mulpuri
*Attorney, Agent, or Firm*—Wolf, Greenfield & Sacks, P.C.

[57] ABSTRACT

A method for forming a shallow junction in a semiconductor wafer includes the steps of implanting a dopant material, such as boron, into the wafer, selecting a fluorine dose and energy corresponding to the dopant material implant to produce a desired junction depth less than 1000 angstroms and a desired sheet resistance, and implanting fluorine into the semiconductor wafer at the selected dose and energy. The dopant material is activated by thermal processing of the semiconductor wafer at a selected temperature for a selected time to form the shallow junction. Residual fluorine and wafer damage may be removed by low temperature annealing following the step of activating the dopant material.

10 Claims, 6 Drawing Sheets

U.S. PATENT DOCUMENTS

| | | | |
|---|---|---|---|
| 5,466,612 | 11/1995 | Fuse et al. | 438/60 |
| 5,654,209 | 8/1997 | Kato | 438/528 |
| 5,897,363 | 4/1999 | Gonzalez et al. | 438/528 |

OTHER PUBLICATIONS

S. P. Jeng et al, "Anomalous Diffusion of Fluorine in Silicon", Appl. Phys. Lett. vol. 61 (11), Sep. 14, 1992, Am. Inst. of Physics, 1992, pp. 1310–1312.

S. Ando et al, "Very Shallow p+–n Junctions and Subquarter Micron Gate p–channel MOSFETs", Sym. on VLSI Tech., Hololulu, Jun. 1990, IEEE pp. 65–66.

S.B Felch et al, "Formation of Deep Sub–Micron Buried Channel PMOSFETs with Plasma Doping" IEEE 1997—Proceedings of the Eleventh Conference on Ion Implatation Technology.

METHODS FOR FORMING SHALLOW JUNCTIONS IN SEMICONDUCTOR WAFERS

FIELD OF THE INVENTION

This invention relates to methods for forming shallow junctions in semiconductor wafers by ion implantation and, more particularly, to methods for retarding diffusion of dopant materials during thermal processing by implanting fluorine into the semiconductor wafer.

BACKGROUND OF THE INVENTION

Ion implantation is a standard technique for introducing conductivity-altering dopant materials into semiconductor wafers. In a conventional ion implantation system, a desired dopant material is ionized in an ion source, the ions accelerated to form an ion beam of prescribed energy, and the ion beam is directed at the surface of the wafer. The energetic ions in the beam penetrate into the bulk of the semiconductor material and are embedded into the crystalline lattice of the semiconductor material. Following ion implantation, the semiconductor wafer is annealed to activate the dopant material. Annealing involves heating the semiconductor wafer to a prescribed temperature for a prescribed time.

A well-known trend in the semiconductor industry is toward smaller, higher speed devices. In particular, both the lateral dimensions and the depths of features in semiconductor devices are decreasing. State of the art semiconductor devices require junction depths less than 1000 angstroms and may eventually require junction depths on the order of 200 angstroms or less.

The implanted depth of the dopant material is determined by the energy of the ions implanted into the semiconductor wafer. Shallow junctions are obtained with low implant energies. However, the annealing process that is used for activation of the implanted dopant material causes the dopant material to diffuse from the implanted region of the semiconductor wafer. As a result of such diffusion, junction depths are increased by annealing. To counteract the increase injunction depth produced by annealing, the implant energy may be decreased, so that a desired junction depth after annealing is obtained. This approach provides satisfactory results, except in the case of very shallow junctions. A limit is reached as to the junction depth that can be obtained by decreasing implant energy, due to the diffusion of the dopant material that occurs during annealing. In addition, ion implanters typically operate inefficiently at very low - implant energies.

Rapid thermal processing can be used to minimize the diffusion that occurs during annealing. However, significant changes to the annealing process, such as reduced annealing temperatures, would reduce the amount of dopant material activated and would thereby adversely affect the operating characteristics of the semiconductor device. The positive effects of fluorine in $BF_2$ implants in reducing the junction depth of $BF_2$ implants as compared with equivalent energy boron implants have been reported in the prior art by K. Ohyu et al in "Advantages of Fluorine Introduction in Boron Implanted Shallow p$^+$/n-Junction Formation", *Japanese Journal of Applied Physics*, Vol. 29, 1990, pages 457–462; D.F. Downey et al "Control of $BF_2$ Dissociation in High Current Ion Implantation", *8th International Conference on Ion Implant Technology*, July 30 –Aug. 3, 1990; and M. Minondo et al "Comparison of $^{11}B^{30}$ and $^{49}BF_2^+$ at Low Implantation Energy in Germanium Preamorphized Silicon", *9th International Conference on Ion Implant Technology*, September 1992. The results were based on relatively high implant energies, i.e., boron equivalent energies of greater than 10 keV. The results were also mixed. In the Downey et al reference, for an 11.2 keV boron implant and a 50 keV $BF_2$ implant, a smaller junction depth was observed for the $BF_2$ implant after a rapid thermal processor anneal, but the reverse was observed after a furnace anneal. In the work of Ohyu et al, fluorine was separately implanted at 25 keV into a 10 keV boron implant, and reduced junction depths were observed.

Separate fluorine implants into boron implanted wafers have also been reported in the following references: T.H. Huang et al, "Influence of Fluorine Preamorphization on the Diffusion and Activation of Low-Energy Implanted Boron During Rapid Thermal Annealing", *Appl. Phys. Lett.* Vol. 65, No. 14, October 1994, pages 1829–1831; H.C. Mogul et al, "Advantages of LDD-Only Implanted Fluorine with Submicron CMOS Technologies", *IEEE Trans. On Electron Devices*, Vol. 44, No. 3, March 1997, pages 388–394; A. Hori et al, "High Speed 0.1um Dual Gate CMOS with Low Energy Phosphorus/Boron Implantation and Cobalt Salicide", *IEDM96*, 1996, pages 575–578; L. Y. Krasnobaev et al, "The Effect of Fluorine on the Redistribution of Boron in Ion-Implanted Silicon", *J. Appl. Phys.*, Vol. 74, No. 10, November 1993, pages 6020–6022 and D. Fan et al, "Effect of Fluorine on the Diffusion of Through-Oxide Implanted Boron in Silicon", *Appl. Phys. Lett.*, Vol. 50, No. 10, September 1991, pages 1212–1214. In these references, boron implants as low as 5 keV were used (the same effective energy as a 22.3 keV $BF_2$ implant), but high energy fluorine implants of 40 keV were used. In these references, no junction depths less than 1000 angstromns were reported, and no sheet resistance values or optimization of sheet resistance was reported. Recent work reported by S. B. Felch et al in "Fluorine Effects in $BF_2$ Implants at Various Energies", 11*th International Conference on Ion Implant Technology*, June 1996, demonstrated that in low energy $BF_2$ implants down to 2 keV, the fluorine leaves the surface of the silicon as a function of implant energy, dose and anneal conditions.

None of the prior art known to applicant has provided a satisfactory process for fabricating shallow junctions of selected junction depth and sheet resistance, particularly where the required junction depth cannot be obtained simply by reducing the implant energy. Accordingly, a need exists for improved methods for fabricating shallow junctions in semiconductor wafers.

SUMMARY OF THE INVENTION

According to a first aspect of the invention, a method for forming a shallow junction impurity region in a semiconductor wafer is provided. The method comprises the steps of implanting a dopant material into the semiconductor wafer, selecting a fluorine dose and energy corresponding to the dopant material implant to produce a desired junction depth less than 1000 angstroms and a desired sheet resistance, and implanting fluorine into the semiconductor wafer at the selected dose and energy. The method further includes the step of activating the dopant material by thermal processing the semiconductor wafer at a selected temperature for a selected time to form the shallow junction. In a preferred embodiment, the dopant material is boron.

The energy of the fluorine may be selected such that the fluorine is implanted at or near an interface between amorphous and crystalline regions, which is present following implantation of the dopant material. The peak of the fluorine implant is preferably slightly deeper than the peak of the dopant material implant.

The step of implanting fluorine may be performed before, during or after the step of implanting the dopant material. The fluorine may be implanted in any desired form. The fluorine and the dopant material are typically implanted at energies less than 10 keV for the formation of shallow junctions.

The method may optionally include the step of removing damage to the semiconductor wafer and removing residual fluorine by low temperature annealing following the step of activating the dopant material.

The invention provides a process for fabricating shallow junctions of selected junction depth and sheet resistance. The invention is particularly significant where the required junction depth cannot be obtained simply by reducing the implant energy.

BRIEF DESCRIPTION OF THE DRAWINGS

For a better understanding of the present invention, reference is made to the accompanying drawings, which are incorporated herein by reference and in which.

DETAILED DESCRIPTION

The need for shallow junctions has increased as semiconductor device dimensions have decreased. In particular, junction depths less than 1000 angstroms, in some cases less than 500 angstroms, and in the future less than 200 angstroms, are required. Typically, shallower junctions are obtained by decreasing implant energies. However, a limit is reached as to the junction depth that can be obtained by decreasing implant energies, due to the diffusion of the dopant material that occurs during annealing. For boron, that limit is typically about 390 angstroms, as measured by spreading resistance profiling (SRP).

Boron is typically implanted as boron ions ($B^+$) or boron difluoride ions ($BF_2^+$). When $BF_2^+$ ions impact the semiconductor wafer, they are split into boron and fluorine atoms. In order to obtain equal junction depths with $B^+$ and $BF_2^+$ ions, the $BF_2^+$ ions must be implanted at higher energy. Thus, for example, $B^+$ ions implanted at 2.0 keV and $BF_2^+$ ions implanted at 8.9 keV provide equivalent boron implant energies.

A number of observations were made in connection with the fabrication of shallow junctions in silicon semiconductor wafers. $B^+$ ions were implanted into wafers at 2.0 keV and a current density of 279 microamps per square centimeter, and $BF_2^+$ ions were implanted into wafers at 8.9 keV and a current density of 101 microamps per square centimeter. The implant energies were selected to provide equivalent boron energies. Both sets of wafers were annealed at 1050° C. for 10 seconds. A junction depth $X_j$ of 1430 angstroms was measured for $B^+$ ions, and a junction depth of 1170 angstroms was measured for $BF_2^+$ ions. Data from X-ray photoelectron spectroscopy (XPS) and secondary ion mass spectroscopy (SIMS) indicated that all fluorine had not diffused from the $BF_2$ implanted wafer following annealing. A junction depth of 940 angstroms was measured for a $BF_2$ implant at 8.9 keV and an anneal of 950° C. for 10 seconds.

In another test, $BF_2^+$ was implanted into wafers at 5 keV. When the wafers were annealed at 1050° C. for 10 seconds, the junction depth was 1120 angstroms (not much reduced from the 8.9 keV $BF_2$ case). By contrast, when the wafers were annealed at 950° C. for 10 seconds, the junction depth was 690 angstroms (as compared with 940 angstroms for the same anneal of the 8.9 keV, $BF_2$ case). The results are summarized in Table I below. Dose rate and beam current alone do not account for these results.

TABLE 1

| Implant | Energy | Anneal | Junction depth (angstroms) |
|---|---|---|---|
| $B^+$ | 2 keV | 1050° C., 10s | 1430 |
| $BF_2^+$ | 8.9 keV | 1050° C., 10s | 1170 |
| $BF_2^+$ | 5 keV | 1050° C., 10s | 1120 |
| $BF_2^+$ | 5 keV | 950° C., 10s | 690 |
| $BF_2^+$ | 8.9 keV | 950° C., 10s | 940 |

It is believed that these results may be explained as follows. As the fluorine diffuses out of the wafer, it preferentially occupies the diffusion sites, effectively blocking or limiting boron diffusion. When the fluorine has diffused out of the silicon, the boron diffusion can then resume. This explanation is supported by the results obtained with $BF_2^+$ ions implanted at 5 keV (the equivalent energy of about a 1 keV boron implant). When the wafer was annealed at 1050° C. for 10 seconds, all fluorine had diffused out of the silicon wafer and boron diffusion occurred, as indicated by the junction depth of 1120 angstroms. By contrast, when the wafer was annealed at 950° C. for 10 seconds, the fluorine had not completely left the silicon and boron diffusion was retarded, as indicated by the junction depth of 690 angstroms.

In accordance with the invention, fluorine is implanted into a silicon semiconductor wafer so as to block or retard diffusion of dopant material during thermal processing. The implanted fluorine is in addition to any fluorine that is chemically bonded to the dopant material during implantation, such as for example $BF_2^+$. The fluorine is preferably implanted into the semiconductor prior to implantation of the dopant material, because the fluorine may amorphize or partially amorphize the wafer and thereby reduce channeling of the subsequently implanted dopant material. By reducing channeling, the implant depth of the dopant material is reduced. However, the fluorine may be implanted during or following implantation of the dopant material. The fluorine retards diffusion of boron or other dopant material as the fluorine diffuses out of the wafer during thermal processing. Some fluorine should remain in the wafer until completion of the high temperature activation anneal.

The fluorine implant preferably meets the following criteria. The energy and dose of the fluorine implant are selected to retard diffusion of the dopant material during thermal processing. Thus, the energy and dose of the fluorine implant depend in part on the dose and energy of the dopant material implant. It will be understood that the energy and dose of dopant material depend on the desired junction depth and sheet resistivity. Furthermore, the dose and energy of the fluorine implant depend on the time and temperature used in thermal processing. In addition, the fluorine implant parameters are preferably selected such that some fluorine remains in the wafer until completion of the high temperature activation anneal, but such that the amount of residual fluorine remaining in the wafer after completion of the high temperature activation anneal is relatively low. Finally, the fluorine implant parameters are preferably selected to minimize damage to the wafer and to minimize adverse effects on sheet resistivity. Fluorine remaining in the wafer after completion of thermal processing may cause the sheet resistivity of the impurity region to be higher than desired or may result in adverse effects in subsequent fabrication steps.

Typically, the fluorine implant energy is selected such that the fluorine is implanted at or near the interface between amorphous and crystalline regions, which is slightly deeper than the peak of the dopant material implant. This interface is present after implantation of the dopant material. When fluorine is implanted before the dopant material, the fluorine energy is selected to implant the fluorine at or near the subsequently-formed interface. Thus, the fluorine implant energy is selected such that the peak of the fluorine implant is slightly deeper than the peak of the dopant material implant. The fluorine implant dose is typically selected based on the desired junction depth and sheet resistivity of the dopant material implant. The range of dose is preferably about 1–5 fluorine atoms per boron atom, but the dose is not limited to this range.

The fluorine may be implanted into the wafer in the form of fluorine ions or other ions which contain fluorine. The dopant material may be boron, which may be implanted as $B^+$ ions or $BF_2^+$ ions. However, the invention may also be used to retard diffusion of arsenic and phosphorus during thermal processing. The invention is considered most useful with respect to fabrication of shallow junctions having depths less than 1000 angstroms, but may be applied to fabrication of impurity regions of any depth.

Figure 1:
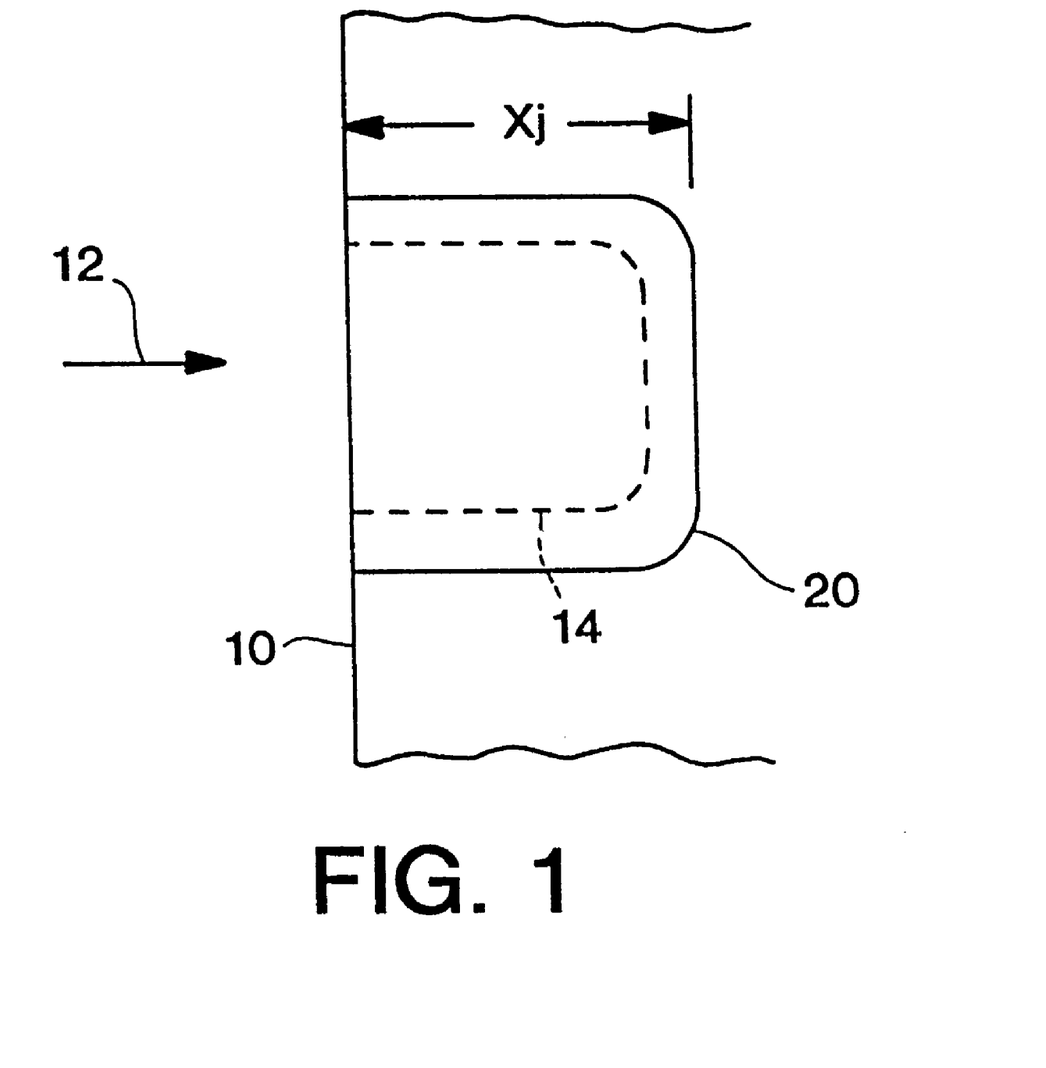
FIG. 1 is a simplified partial cross sectional view of a semiconductor wafer.

A simplified partial cross sectional view of a semiconductor wafer 10 is shown in FIG. 1. An ion beam 12 of a dopant material is directed at wafer 10, producing an implanted region 14. The wafer 10 is then annealed, typically in a rapid thermal processor, to activate the dopant material. The annealing process causes diffusion of the dopant material to an impurity region 20 that is larger than the implanted region 14. The impurity region 20 is characterized by a junction depth $X_j$, which is the depth of the impurity region 20 normal to the surface of wafer 10. As described above, the increase in junction depth produced by annealing places a lower limit on the junction depth $X_j$ that can be achieved, except when the process of the invention is used. In accordance with the invention, a fluorine implant is used to reduce or eliminate diffusion of dopant material during thermal processing, thereby minimizing the difference between the implanted depth of dopant material and the final junction depth $X_j$.

Figure 2:
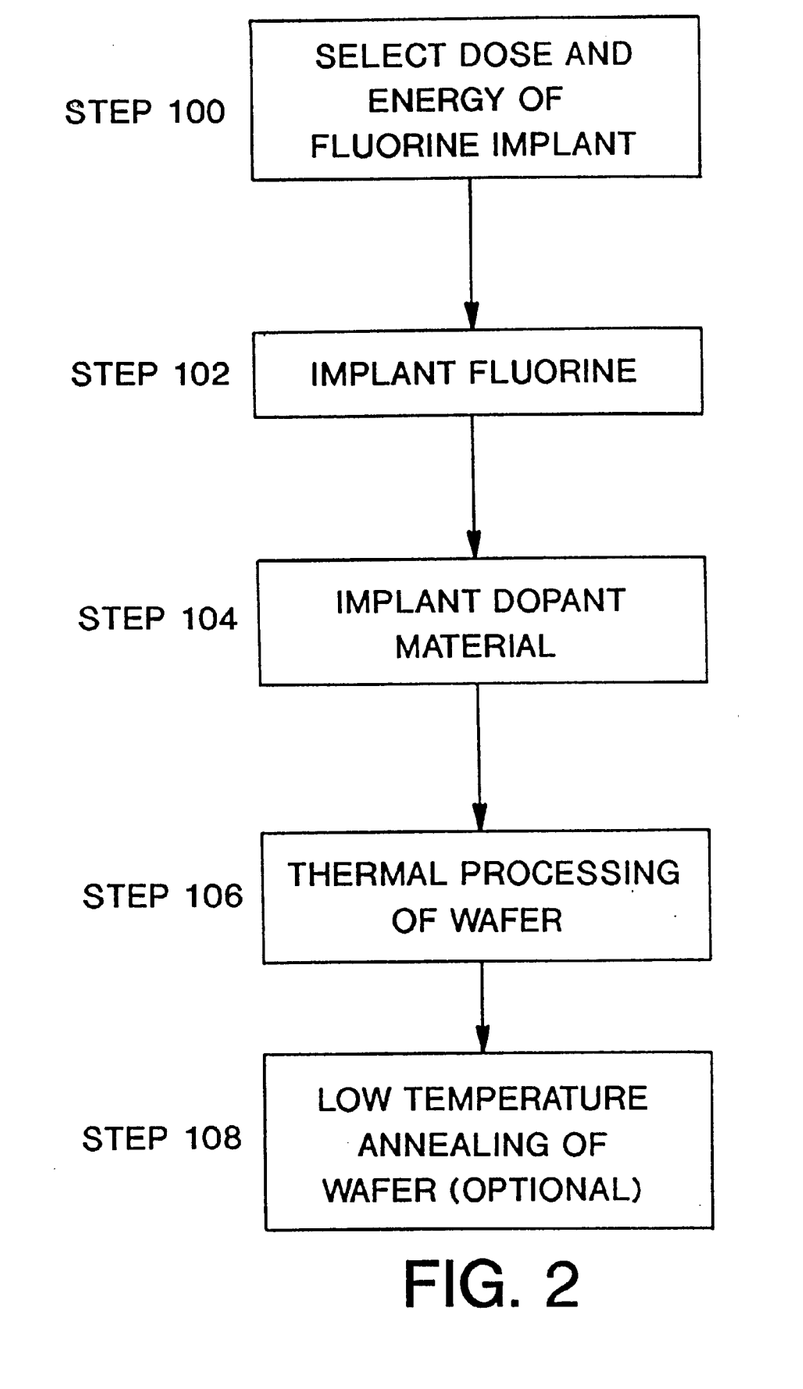
FIG. 2 is a flow chart showing an example of a process for fabricating a shallow junction in a semiconductor wafer in accordance with the invention.

A flow diagram of the processing steps associated with the present invention is shown in FIG. 2. In step 100, a fluorine dose and energy are selected. The criteria for selection of fluorine dose and energy are described above, and examples are given below. In step 102, fluorine is implanted into the wafer at the dose and energy selected in step 100. By way of example, fluorine may be implanted using the Model VIIS ion 80 PLUS, manufactured and sold by Varian Associates, Inc. For shallow junction depths, i.e., those with junction depths less than about 1000 angstroms, the fluorine energy is typically in a range of about 1 keV to 10 keV, and the fluorine dose is typically in a range of about $5e14/cm^2$ to $5e15/cm^2$. (The notation $5e14/cm^2$ indicates an implant dose of $5\times10^{14}$ atoms per square centimeter.) In step 104, the dopant material is implanted into the semiconductor wafer. By way of example, $B^{30}$ ions or $BF_2^+$ ions may be implanted in the wafer. The energy and dose of the dopant material depend on the required junction depth and resistivity of the impurity region in the semiconductor device being fabricated. As noted above, the fluorine implant of step 102 may be performed before, during or after the dopant material implant of step 104.

In step 106, the wafer is annealed by rapid thermal processing to activate the dopant material. An example of a rapid thermal processor is the Model SH2800e manufactured by STEAG AST elektroniks. The anneal time and temperature depend on the desired characteristics of the semiconductor device being fabricated. Typical annealing processes utilize temperatures in a range of about 950° C. to 1050° C. and times of about 10 to 30 seconds.

An optional low temperature annealing process 108 may be performed following the high temperature activation annealing process 106. The low temperature annealing process 108 may be utilized to eliminate residual damage to the silicon wafer and to drive any remaining fluorine out of the wafer. Typical low temperature annealing processes utilize temperatures in a range of about 550° C. to 650° C. for times of about 30 to 60 minutes. Boron diffusion at these temperatures is negligible.

The effectiveness of the present invention is best illustrated by examples where the additional fluorine implant enables the formation of a shallow junction having the desired sheet resistance, and the specified junction parameters cannot be obtained simply by lowering the energy of the implant. The following tests were performed, and the results are summarized in Table 2 below. A 5 keV, $1e15/cm^2$, 0° implant angle, $BF_2$ implant annealed at 1050° C. seconds on an AST elektroniks SH2800 Rapid Thermal Processor without an additional fluorine implant produced, as measured by SRP, a junction depth of 390 angstroms and a sheet resistance value of 356 ohms per square. Lowering the implant energy to 2.2 keV with the same anneal parameters actually produced a deeper junction of 412 angstroms and higher sheet resistance value of 432 ohms per square. The reason for this result is that for the 2.2 keV implant, the fluorine had diffused out of the wafer, at least in the subsurface areas of concern, before the anneal was complete, allowing the boron to diffuse at a faster rate in the absence of fluorine. The effectiveness of additional fluorine implants is demonstrated by the examples where the 5 keV, $1e15/cm^2$, $BF_2$ implants were preceded by a fluorine implant, one at a dose of $2e15/cm^2$ and the other at a dose of $5e15/cm^2$. The energy of each fluorine implant was 2.8 keV, which placed the fluorine peak slightly deeper than the implanted boron of the 5 keV, $BF_2$ implant. The results show that for the $2e15/cm^2$ fluorine implant, the junction depth was decreased from 390 angstroms to 315 angstroms, with a sheet resistance value of 499 ohms per square. For the $5e15/cm^2$ fluorine implant, the junction depth was further decreased to 268 angstroms, with a sheet resistance value of 694 ohms per square. It should be noted that shallow junctions produce a higher sheet resistance value because of a lower hole mobility value inherent in the shallower junction.

TABLE 2

| Implant | Anneal | Junction depth (angstroms) | Sheet resistance (ohms/sq.) |
|---|---|---|---|
| $BF_2$, 1e15/cm$^2$, 5 keV | 1050° C., 10s | 390 | 356 |
| $BF_2$, 1e15/cm$^2$, 2.2 keV | 1050° C., 10s | 412 | 432 |
| F, 2e15/cm$^2$, 2.8 keV + $BF_2$, 1e15/cm$^2$, 5 keV | 1050° C., 10s | 315 | 499 |
| F, 5e15/cm$^2$, 2.8 keV + $BF_2$, 1e15/cm$^2$, 5 keV | 1050° C., 10s | 268 | 694 |
| F, 5e15/cm$^2$, 2.8 keV + $BF_2$, 1e15/cm$^2$, 5 keV | 1050° C., 10s + 550° C., 30 min | 287 | 656 |

The above examples clearly demonstrate that the additional fluorine implant permits formation of shallow junctions that cannot be achieved by lowering the energy of the implant alone. In addition, these examples demonstrate the effect of the fluorine dose, which for any given process can be balanced with the primary implant parameters to produce a desired junction depth and sheet resistance value.

Figure 3:
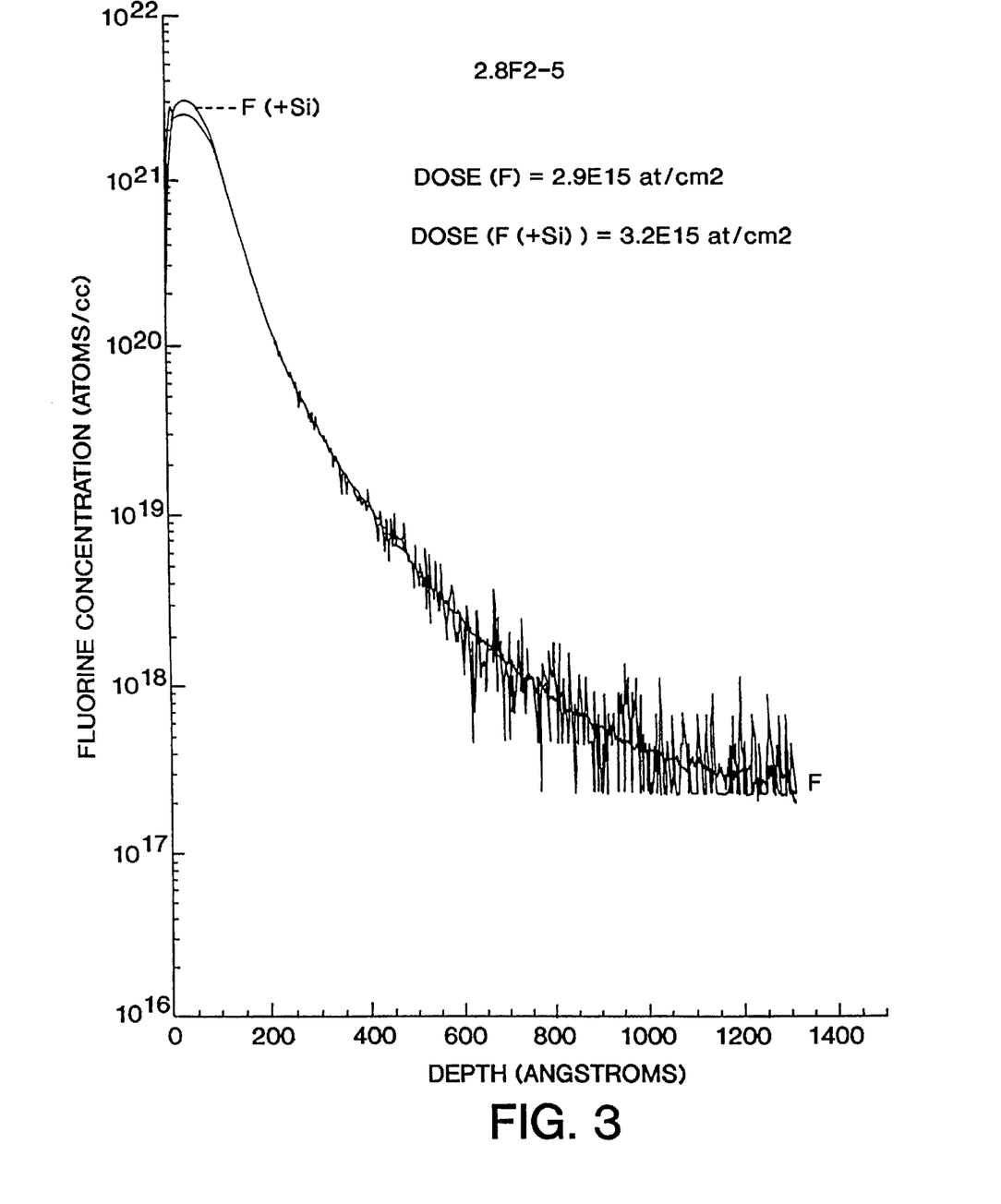
FIG. 3 is a graph of fluorine concentration as a function of depth for a $BF_2$ implant, as implanted (no anneal)
Figure 4:
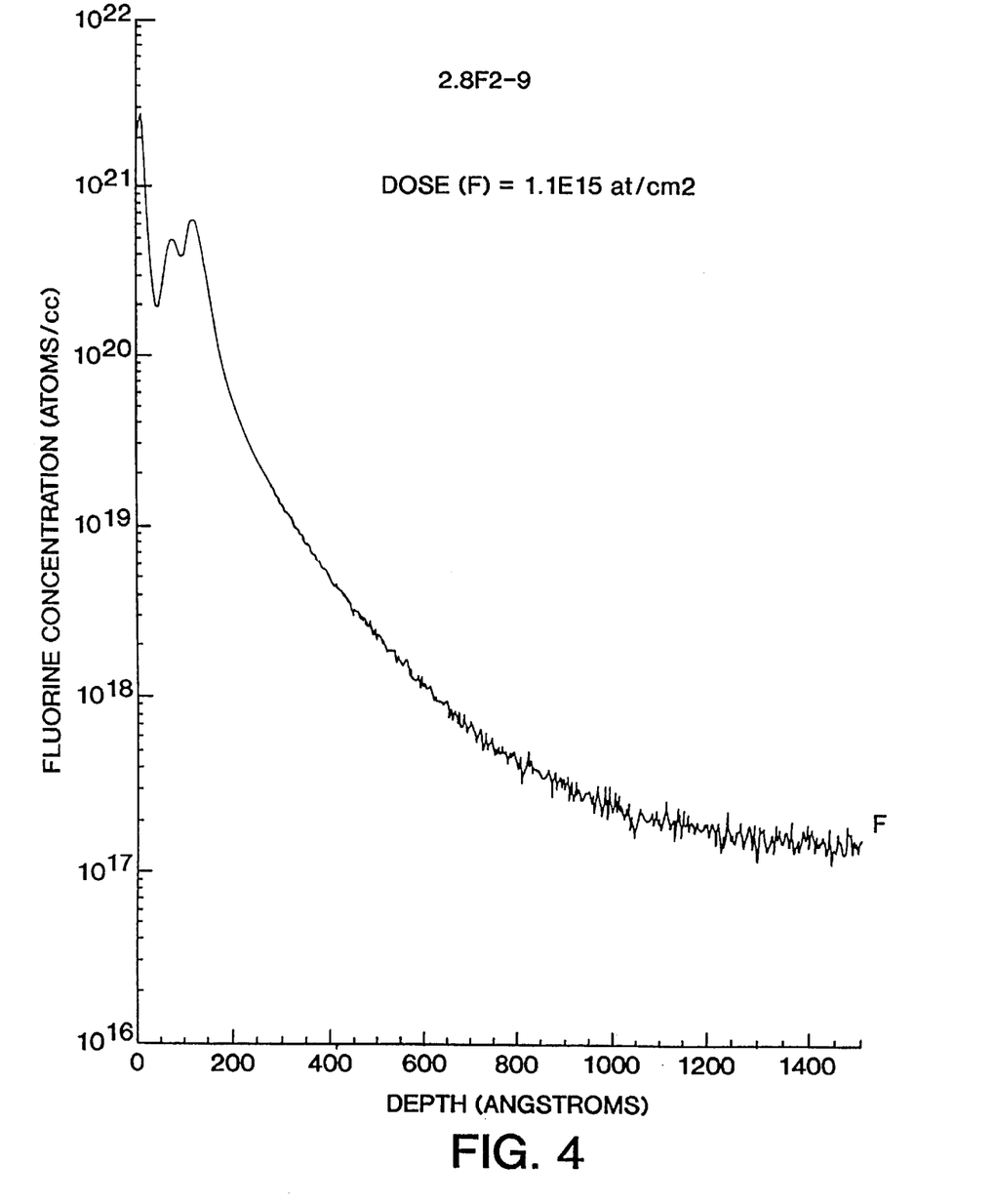
FIG. 4 is a graph of fluorine concentration as a function of depth for a $BF_2$ implant followed by a low temperature anneal only.

The effectiveness of the present invention requires that some fluorine be left in the silicon at the completion of the high temperature activation anneal. To remove remaining fluorine and any residual damage, an optional low temperature anneal can be employed. The low temperature anneal is preferably performed at 550° C. to 650° C. for 30 to 60 minutes in a furnace. In this temperature range, boron does not diffuse appreciably, but fluorine diffuses out of the wafer and damage is repaired. A low temperature anneal prior to the high temperature anneal has been shown to reduce fluorine content by 62%, showing the effectiveness of the low temperature anneal at removing fluorine. FIG. 3 is a graph of fluorine concentration as a function of depth for a $BF_2$ implant at a dose of 1e15/cm$^2$ and an energy of 5 keV, as implanted (no anneal). FIG. 4 is a graph of fluorine concentration as a function of depth for the same $BF_2$ implant parameters after a low temperature anneal at 550° C. for 30 minutes (no high temperature anneal). The fluorine content following the low temperature anneal was reduced by 62%. Since, the fluorine is needed during the high temperature anneal, the low temperature anneal must be performed after the high temperature activation anneal.

Figure 5:
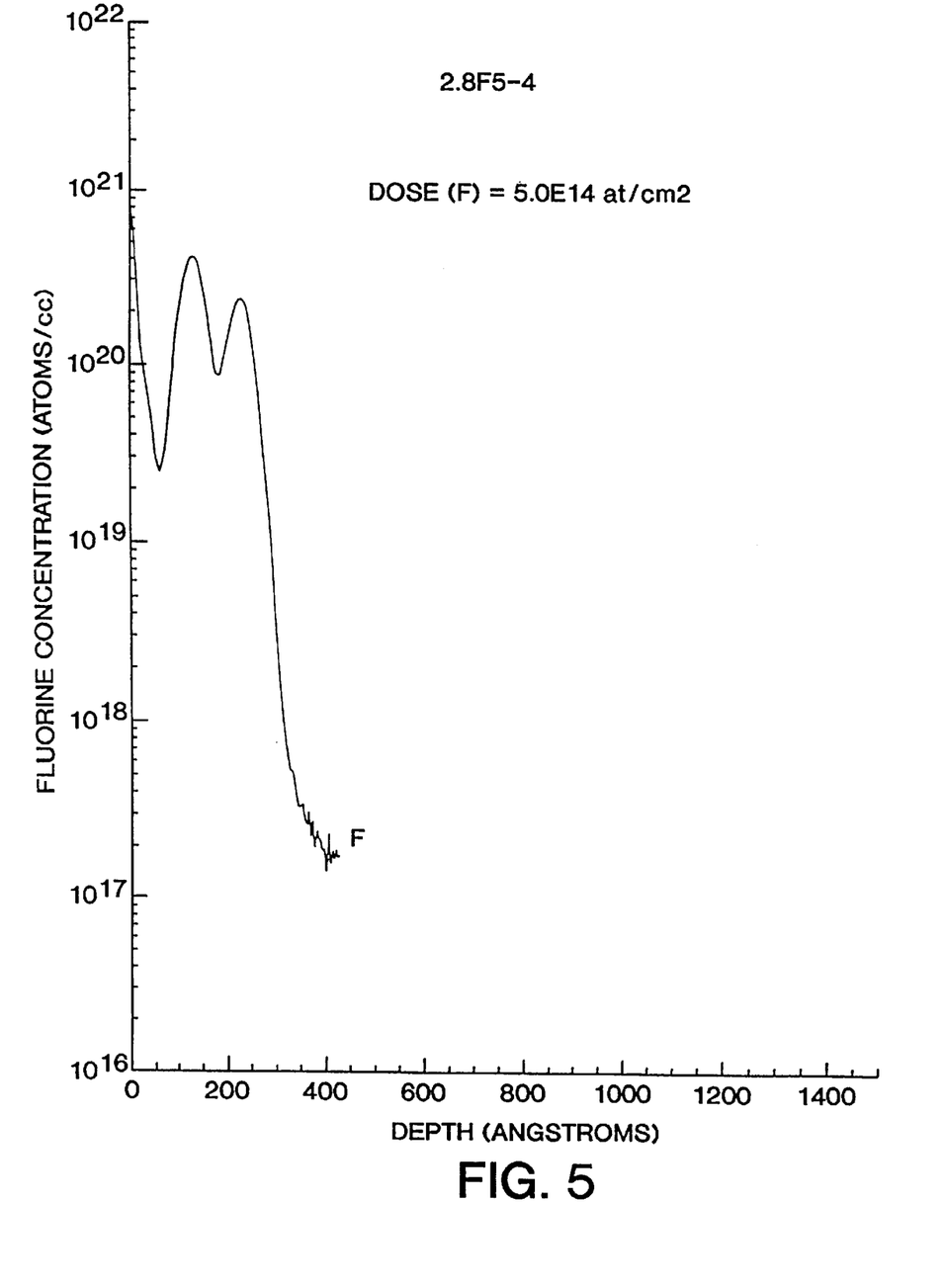
FIG. 5 is a graph of fluorine concentration as a function of depth for a $BF_2$ implant and a fluorine implant followed by a high temperature anneal only.
Figure 6:
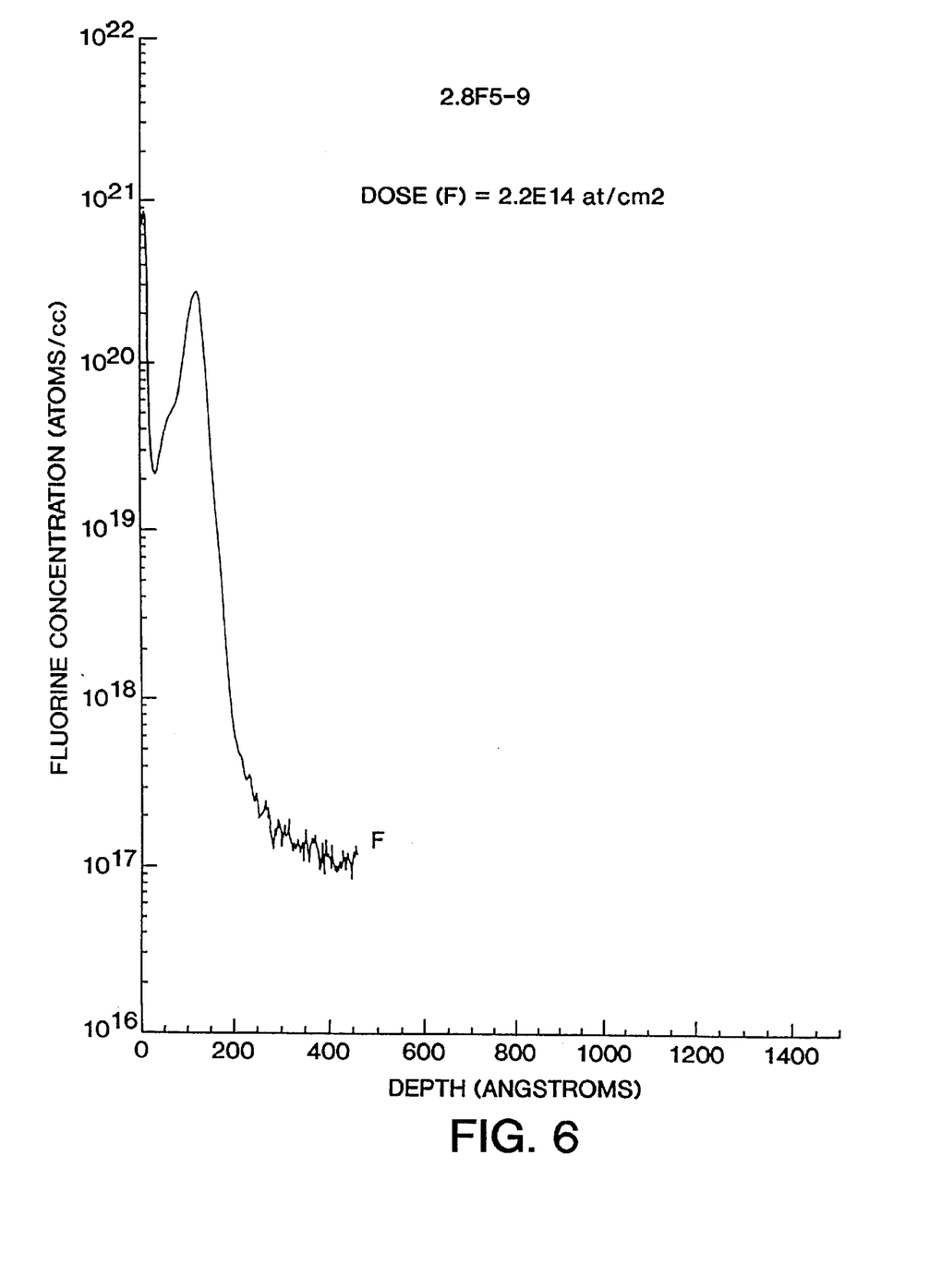
FIG. 6 is a graph of fluorine concentration as a function of depth for a $BF_2$ implant and a fluorine implant followed by a high temperature anneal, which in turn was followed by a low temperature anneal.

The effectiveness of the low temperature anneal following the high temperature activation anneal is demonstrated in FIGS. 5 and 6. In both FIGS. 5 and 6, wafers were implanted with $BF_2$ at a dose of 1e15/cm$^2$ and an energy of 5 keV, and were implanted with fluorine at a dose of 5e15/cm$^2$ and an energy of 2.8 keV. FIG. 5 is a graph of fluorine concentration as a function of depth where the wafer was subjected to a high temperature anneal at 1050° C. for 10 seconds (no low temperature anneal). FIG. 6 is a graph of fluorine concentration as a function of depth where the wafer was subjected to a high temperature anneal at 1050° C. for 10 seconds followed by a low temperature anneal at 550° C. for 30 minutes. Following the low temperature anneal, the fluorine content was reduced by 56% and the subsurface peaks were reduced from 2 to 1, indicating a reduction in damage level. This approach, with a fluorine implant that is properly balanced to the desired $BF_2$ implant, or other implant species, can yield relatively damage-free, fluorine-free silicon substrates. In the above example, the junction depth of the boron increased from 268 angstroms to 287 angstroms and the sheet resistance improved from 694 to 656 ohms per square following the low temperature anneal.

When shallower junctions are required, the procedure can be optimized for lower energy implants. In each case, the fluorine dose and position, which corresponds to energy, are selected based on the desired junction depth and sheet resistance. For $BF_2$ implants of 4.25, 3.5 and 2.2 keV, typical fluorine implant energies are 2.4, 2.0 and 1.2 keV, respectively. Using the process of the present invention, junctions as measured by SRP of below 200 angstroms with sheet resistance values of 400 to 600 ohms per square should be achievable. The technique of matching fluorine dose and energy to the dopant material implant and the sequence of high temperature activation anneal followed by a low temperature furnace anneal allows for near damage-free, fluorine-free junctions that are much shallower and have lower sheet resistance values than are obtainable by prior art techniques. The implants can be performed at higher, more economical implant energies, where beam currents are significantly higher.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for forming a shallow junction in a semiconductor wafer, comprising the steps of:
    implanting a dopant material into the semiconductor wafer;
    selecting a fluorine dose and energy corresponding to the implant of said dopant material to produce a desired junction depth less than 1000 angstroms and a desired sheet resistance, wherein the step of selecting a fluorine dose and energy includes selecting a fluorine energy less than about 10 keV and selecting a fluorine dose in a range of about 5e14/cm$^2$ to 5e15/cm$^2$;
    implanting fluorine into the semiconductor wafer at the selected dose and energy, wherein the step of implanting fluorine is performed before or after the step of implanting said dopant material;
    activating said dopant material by thermal processing of the semiconductor wafer at a selected temperature for a selected time to form said shallow junction; and low temperature annealing of the semiconductor wafer following the step of activating said dopant material to remove residual fluorine and to remove damage to the semiconductor wafer, wherein the step of low temperature annealing is performed at a temperature of about 550° C. to 650° C. for about 30 to 60 minutes.

2. A method for forming a shallow junction as defined in claim 1 wherein the step of selecting a fluorine dose and energy includes selecting said dose and energy of said fluorine such that at least a portion of said fluorine remains in the semiconductor wafer upon completion of the step of activating said dopant material.

3. A method for forming a shallow junction as defined in claim 1 wherein the step of implanting fluorine includes selecting the energy of said fluorine such that said fluorine is implanted slightly deeper than said dopant material.

4. A method for forming a shallow junction as defined in claim 1 wherein the step of implanting a dopant material includes implanting B$^+$ ions or $BF_2^+$ ions.

5. A method for forming a shallow junction as defined in claim 1 wherein the step of implanting fluorine includes implanting fluorine-containing ions.

6. A method for forming a shallow junction as defined in claim 1 wherein said junction has a depth less than 500 angstroms.

7. A method for forming a shallow junction as defined in claim 1 wherein the step of selecting a fluorine dose and energy includes selecting a fluorine dose of about 1 to 5 fluorine atoms per atom of dopant material.

8. A method for forming a shallow junction in a semiconductor wafer, comprising the steps of;

implanting boron into the semiconductor wafer;

selecting a fluorine dose and energy corresponding to the boron implant to produce a desired junction depth less than 1000 angstroms and a desired sheet resistance, wherein the step of selecting a fluorine dose and energy includes selecting a fluorine energy less than about 10 keV and selecting a fluorine dose in a range of about $5e14/cm^2$ to $5e15/cm^2$;

implanting fluorine into the semiconductor wafer at the selected dose and energy, wherein the step of implanting fluorine is performed before or after the step of implanting boron;

activating said boron by thermal processing of the semiconductor wafer at a selected temperature for a selected time to form said shallow junction; and low temperature annealing of the semiconductor wafer following the step of activating said boron to remove residual fluorine and to remove damage to the semiconductor wafer, wherein the step of low temperature annealing is performed at a temperature of about 550° C. to 650° C. for about 30 to 60 minutes.

9. A method for forming a shallow junction as defined in claim 8 wherein the step of implanting boron includes implanting $B^+$ ions or $BF_2^+$ ions.

10. A method for forming a shallow junction as defined in claim 8 wherein the step of selecting a fluorine dose and energy includes selecting a fluorine dose of about 1 to 5 fluorine atoms per atom of boron.

* * * * *